United States Patent
Xu et al.

(10) Patent No.: US 7,122,482 B2
(45) Date of Patent: Oct. 17, 2006

(54) METHODS FOR FABRICATING PATTERNED FEATURES UTILIZING IMPRINT LITHOGRAPHY

(75) Inventors: Frank Y. Xu, Austin, TX (US); Nicholas E. Stacey, Austin, TX (US); Michael P. C. Watts, Austin, TX (US); Ecron D. Thompson, Austin, TX (US)

(73) Assignees: Molecular Imprints, Inc., Austin, TX (US); University of Texas System, Austin, TX (US)

( * ) Notice: Subject to any disclaimer, the term of this patent is extended or adjusted under 35 U.S.C. 154(b) by 32 days.

(21) Appl. No.: 10/694,284

(22) Filed: Oct. 27, 2003

(65) Prior Publication Data
US 2005/0100830 A1   May 12, 2005

(51) Int. Cl.
*H01L 21/302* (2006.01)
*H01L 21/461* (2006.01)

(52) U.S. Cl. .............. 438/738; 438/712; 438/725; 438/799; 438/737; 264/293; 427/198

(58) Field of Classification Search .......... 438/712, 438/725, 733, 737, 738; 264/293; 427/198
See application file for complete search history.

(56) References Cited

U.S. PATENT DOCUMENTS

| | | | |
|---|---|---|---|
| 3,810,874 A | 5/1974 | Mitsch et al. |
| 4,267,212 A | 5/1981 | Sakawaki |
| 4,440,804 A | 4/1984 | Milgram |
| 4,451,507 A | 5/1984 | Beltz et al. |
| 4,512,848 A | 4/1985 | Deckman et al. |
| 4,614,667 A | 9/1986 | Larson et al. |
| 4,617,238 A | 10/1986 | Crivello et al. |
| 4,731,155 A | 3/1988 | Napoli et al. |
| 4,826,943 A | 5/1989 | Ito et al. |
| 4,931,351 A | 6/1990 | McColgin et al. |
| 5,028,366 A | 7/1991 | Harakal et al. |
| 5,169,494 A | 12/1992 | Hashimoto et al. |
| 5,259,926 A | 11/1993 | Kuwabara et al. |

(Continued)

FOREIGN PATENT DOCUMENTS

DE    2800476    7/1978

(Continued)

OTHER PUBLICATIONS

Wolf and Tauber; Silicon Processing for the VLSI Era vol. 1: Process Technology; 1986; Lattice Press, Sunset Bech, CA; pp. 541, 542, 544, 564 and 565.*

(Continued)

*Primary Examiner*—Fernando L. Toledo
(74) *Attorney, Agent, or Firm*—Winstead, Sechrest & Minick PC; Kenneth C. Brooks; Michael D. Carter

(57) ABSTRACT

One embodiment of the present invention is a method for generating patterned features on a substrate that includes: (a) forming a first layer on at least a portion of a surface of the substrate, the first layer comprising at least one layer of a first material, which one layer abuts the surface of the substrate; (b) forming a second layer of a second material on at least a portion of the first layer, which second layer is imprinted with the patterned features; (c) removing at least portions of the second layer to extend the patterned features to the first layer; and (d) removing at least portions of the first layer to extend the patterned features to the substrate; wherein the first layer and the second layer may be exposed to an etching process that undercuts the patterned features, and the first material may be lifted-off.

31 Claims, 5 Drawing Sheets

U.S. PATENT DOCUMENTS

| | | | |
|---|---|---|---|
| 5,331,020 A | 7/1994 | Brown et al. | |
| 5,369,722 A | 11/1994 | Heming et al. | |
| 5,389,696 A | 2/1995 | Dempsey et al. | |
| 5,425,848 A | 6/1995 | Haisma et al. | |
| 5,480,047 A | 1/1996 | Tanigawa et al. | |
| 5,542,978 A | 8/1996 | Kindt-Larsen et al. | |
| 5,594,042 A | 1/1997 | Glover et al. | |
| 5,601,641 A | 2/1997 | Stephens | |
| 5,629,095 A | 5/1997 | Bujanowski et al. | |
| 5,772,905 A | 6/1998 | Chou | |
| 5,776,748 A | 7/1998 | Singhvi et al. | |
| 5,837,314 A | 11/1998 | Beaton et al. | |
| 5,849,209 A | 12/1998 | Kindt-Larsen et al. | |
| 5,849,222 A | 12/1998 | Jen et al. | |
| 5,861,467 A | 1/1999 | Bujanowski et al. | |
| 5,900,160 A | 5/1999 | Whitesides et al. | |
| 5,948,470 A | 9/1999 | Harrison et al. | |
| 6,039,897 A | 3/2000 | Lochhead et al. | |
| 6,132,632 A | 10/2000 | Haney et al. | |
| 6,204,343 B1 | 3/2001 | Barucha et al. | |
| 6,309,580 B1 | 10/2001 | Chou | |
| 6,316,290 B1 | 11/2001 | Wensel | |
| 6,334,960 B1 | 1/2002 | Willson et al. | |
| 6,337,262 B1 | 1/2002 | Pradeep et al. | |
| 6,344,105 B1 | 2/2002 | Daugherty et al. | |
| 6,391,217 B1 | 5/2002 | Schaffer et al. | |
| 6,468,642 B1 | 10/2002 | Bray et al. | |
| 6,475,704 B1 | 11/2002 | Iwasaki et al. | |
| 6,482,742 B1 | 11/2002 | Chou | |
| 6,503,829 B1 * | 1/2003 | Kim et al. | 438/637 |
| 6,503,914 B1 | 1/2003 | Benish et al. | |
| 6,517,995 B1 | 2/2003 | Jacobenson et al. | |
| 6,518,189 B1 | 2/2003 | Chou | |
| 6,544,594 B1 | 4/2003 | Linford et al. | |
| 6,565,778 B1 | 5/2003 | Li et al. | |
| 6,580,172 B1 | 6/2003 | Mancini et al. | |
| 6,646,662 B1 | 11/2003 | Nebashi et al. | |
| 6,649,272 B1 | 11/2003 | Moore et al. | |
| 6,664,306 B1 | 12/2003 | Gaddam et al. | |
| 6,696,220 B1 | 2/2004 | Bailey et al. | |
| 6,713,238 B1 | 3/2004 | Chou et al. | |
| 6,721,529 B1 | 4/2004 | Chen et al. | |
| 6,737,489 B1 | 5/2004 | Linert et al. | |
| 6,774,183 B1 | 8/2004 | Palumbo et al. | |
| 6,776,094 B1 | 8/2004 | Whitesides et al. | |
| 6,790,905 B1 | 9/2004 | Fitzgerald et al. | |
| 6,802,870 B1 | 10/2004 | Chang et al. | |
| 6,809,356 B1 | 10/2004 | Chou | |
| 6,828,244 B1 | 12/2004 | Chou | |
| 6,830,819 B1 | 12/2004 | Kaplan et al. | |
| 7,037,639 B1 * | 5/2006 | Voisin | 430/316 |
| 2001/0044075 A1 | 11/2001 | Nishimura et al. | |
| 2002/0042027 A1 | 4/2002 | Chou et al. | |
| 2002/0093122 A1 | 7/2002 | Choi et al. | |
| 2002/0094496 A1 | 7/2002 | Choi et al. | |
| 2002/0098426 A1 | 7/2002 | Sreenivasan et al. | |
| 2002/0132482 A1 | 9/2002 | Chou | |
| 2002/0167117 A1 | 11/2002 | Chou | |
| 2002/0177319 A1 | 11/2002 | Chou | |
| 2003/0034329 A1 | 2/2003 | Chou | |
| 2003/0080471 A1 | 5/2003 | Chou | |
| 2003/0080472 A1 | 5/2003 | Chou | |
| 2003/0235787 A1 | 12/2003 | Watts et al. | |
| 2004/0007799 A1 | 1/2004 | Choi et al. | |
| 2004/0008334 A1 | 1/2004 | Sreenivasan et al. | |
| 2004/0009673 A1 | 1/2004 | Sreenivasan et al. | |
| 2004/0010341 A1 | 1/2004 | Watts et al. | |
| 2004/0021254 A1 | 2/2004 | Sreenivasan et al. | |
| 2004/0021866 A1 | 2/2004 | Watts et al. | |
| 2004/0022888 A1 | 2/2004 | Sreenivasan et al. | |
| 2004/0036201 A1 | 2/2004 | Chou et al. | |
| 2004/0038552 A1 | 2/2004 | Watts et al. | |
| 2004/0046271 A1 | 3/2004 | Watts | |
| 2004/0046288 A1 | 3/2004 | Chou | |
| 2004/0065252 A1 | 4/2004 | Sreenivasan et al. | |
| 2004/0110856 A1 | 6/2004 | Young et al. | |
| 2004/0118809 A1 | 6/2004 | Chou et al. | |
| 2004/0124566 A1 | 7/2004 | Sreenivasan et al. | |
| 2004/0131718 A1 | 7/2004 | Chou et al. | |
| 2004/0137734 A1 | 7/2004 | Chou et al. | |
| 2004/0156108 A1 | 8/2004 | Chou et al. | |
| 2004/0170770 A1 | 9/2004 | Nguyen et al. | |
| 2004/0192041 A1 | 9/2004 | Jeong et al. | |
| 2004/0197843 A1 | 10/2004 | Chou et al. | |
| 2004/0256764 A1 * | 12/2004 | Choi et al. | 264/293 |
| 2005/0118749 A1 * | 6/2005 | Sakamoto et al. | 438/107 |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| WO | WO 99/05724 | 2/1999 |
| WO | WO 00/21689 | 4/2000 |
| WO | WO 01/47003 | 6/2001 |
| WO | WO 01/69317 | 9/2001 |
| WO | WO 01/90816 | 11/2001 |
| WO | WO 02/07199 | 1/2002 |
| WO | WO 02/22916 | 3/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Krauss et al., "Fabrication of Nanodevices Using Sub-25nm Imprint Lithography," Appl. Phys. Lett 67(21), 3114-3116, 1995.

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Haisma et al., "Mold-Assisted Nanolithography: A Process for Reliable Pattern Replication," Journal of Vacuum Science and Technology, Nov./Dec. 1996, pp. 4124-4128, vol. B 14(6).

Chou et al., "Imprint Lithography with Sub-10nm Feature Size and High Throughput," Microelectronic Engineering, 1997, pp. 237-240, vol. 35.

Xia et al., "Soft Lithography," Annu. Rev. Mater. Sci., 1998, pp. 153-184, vol. 28.

Xia et al., "Soft Lithography," Agnew. Chem. Int. Ed., 1998, pp. 550-575, vol. 37.

Wu et al., "Large Area High Density Quantized Magnetic Disks Fabricated Using Nanoimprint Lithography," Journal of Vacuum Science and Technology, Nov./Dec. 1998, pp. 3825-3829, vol. B 16(6).

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965-2982, vol. 17.

Chou, "Nanoimprint Lithography and Lithography Induced Self-Assembly," MRS Bulletin, Jul. 2001, pp. 512-517.

Mirkin et al., "Emerging Methods for Micro-and Nanofabrication," MRS Bulletin, Jul. 2001, pp. 506-509.

Choi et al., "High Precision Orientation Alignment and Gap Control Stages for Imprint Lithography Processes," U.S. Appl. No. 09/698,317, filed Oct. 27, 2000.

Bender M. et al., "Fabrication of Nanostructures using a UV-based Imprint Technique," Microelectronic Engineering, pp. 223-236, 2000.

Nguyen, A. Q., "Asymmetric Fluid-Structure Dynamics in Nanoscale Imprint Lithography," University of Texas at Austin, Aug. 2001.

Sreenivasan et al., "A Method of Forming A Layer on A Substrate To Facilitate Fabrication Of Metrology Standards," U.S. Appl. No. 10/264,926, filed Oct. 4, 2002.

Sreenivasan, "Postive Tone Bi-Layer Imprint Lithography Method," U.S. Appl. No. 10/396,615, filed Mar. 25, 2003.

Sreenivasan, "A Method Of Forming Stepped Structures Employing Imprint Lithography," U.S. Appl. No. 10/423,642, filed Apr. 25, 2003.

Choi et al., "Method To Reduce Adhesion Between A Conformable Region And A Pattern Of A Mold," U.S. Appl. No. 10/463,396, filed Jul. 17, 2003.

U.S. Appl. No. 10/687,519, filed Oct. 16, 2003, Nguyen et al.

U.S. Appl. No. 11/027,473, filed Dec. 30, 2004, Bailey et al.

U.S. Appl. No. 10/948,511, filed Sep. 23, 2004, Xu et al.

U.S. Appl. No. 10/967,740, filed Oct. 18, 2004, Xu et al.

U.S. Appl. No. 10/919,224, filed Aug. 16, 2004, Xu et al.

U.S. Appl. No. 11/026,821, filed Dec. 30, 2004, Willson et al.

U.S. Appl. No. 11/062,420, filed Feb. 22, 2005, Willson et al.

U.S. Appl. No. 11/068,397, filed Feb. 28, 2005, Xu et al.

U.S. Appl. No. 11/068,174, filed Feb. 28, 2005, Xu et al.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Johnson et al., Advances in Step and Flash Imprint Lithography, SPIE Microlithography Conference, Feb. 23, 2003.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.

Translation of Japanese Patent 02-24848.

Hirai et al., Mold Surface Treatment for Imprint Lithography, Journal of Photopolymer Science and Technology, vol. 14, No. 3, pp. 457-462, Aug. 1, 2001.

Roos et al., Nanoimprint Lithography with a Commercial 4 Inch Bond System for Hot embossing, Proceedings of SPIE vol. 4343, pp. 427-435, Oct. 1, 2001.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001.

Yu et al., Properties of Fluorinated Amorphous Diamond Like Carbon Films by PECVD, Applied Surface Science 219 (3-4); pp. 228-237, Dec. 1, 2003.

Compon et al., Electroanalysis at Diamond-Like and Doped-Diamond Electrodes, Electroanalysis 15(17); pp. 1349-1363, Sep. 1, 2003.

Mansano et al., Protective Carbon Layer for Chemical Corrosion of Stainless Steel, Diamond and Related Materials 12 (3-7); pp. 749-752, Mar. 1, 2003.

Butter et al., Production and Wetting Properties of Fluorinated Diamond-Like Carbon Coatings, Thin Solid Films, 311(1-2); pp. 107-113, Dec. 31, 1997.

Hakovirta et al., Heat Resistance of Fluorinated Diamond-Like Carbon Films, Diamond and Related Materiasl 10(8); pp. 1486-1490, Aug. 1, 2001.

Zhu et al., The Improvement of the Oxidation Resistance of TiAl Alloys by Fluorine Plasma-Based Ion Implantation, Surface and Coatings Technology 158; pp. 502-507, Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178, Apr. 17, 2004.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

Golden et al., Designing Porous Low-k Dielectrics, www.reed-electronics.com/semiconductor/index.asp?layout=articlePrint&articleID=CA82824, Apr. 6, 2005.

Padovani et al., Chemically Bonded Porogens in Methylsilsesquioxane: I. Structure and Bonding, Journal of the Electrochemical Society, 149(12) F161-F170, Oct. 16, 2002.

Wolf et al., Silicon Processing for the VLSI Era, vol. 1—Process Technology, pp. 407-413, Jan. 1, 1986.

\* cited by examiner

METHODS FOR FABRICATING PATTERNED FEATURES UTILIZING IMPRINT LITHOGRAPHY

BACKGROUND OF THE INVENTION

One or more embodiments of the present invention relate generally to methods for fabricating patterned features utilizing imprint lithography.

There is currently a strong trend, for example and without limitation, in the semiconductor manufacturing industry, toward micro-fabrication, i.e., fabricating small structures and downsizing existing structures. For example, micro-fabrication typically involves fabricating structures having features on the order of micro-meters or smaller.

One area in which micro-fabrication has had a sizeable impact is in microelectronics. In particular, downsizing microelectronic structures has generally enabled such microelectronic structures to be less expensive, have higher performance, exhibit reduced power consumption, and contain more components for a given dimension relative to conventional electronic devices. Although micro-fabrication has been utilized widely in the electronics industry, it has also been utilized in other applications such as biotechnology, optics, mechanical systems, sensing devices, and reactors.

As is well known, methods for fabricating patterned features are an important part of micro-fabrication. In the art of micro-fabrication of, for example and without limitation, semiconductor devices, "lift-off" is a well known method for fabricating patterned metal features such as, for example and without limitation, lines on a substrate or wafer. FIGS. 1A–1D illustrate a well known process for fabricating patterned metal features in which a photoresist mask is undercut by a developer prior to metal deposition. As shown in FIG. 1A, substrate 100 has been coated with photoresist layer 110 in accordance with any one of a number of methods that are well known to those of ordinary skill in the art, and photoresist mask layer 110 has been patterned in accordance with any one of a number of methods that are well known to those of ordinary skill in the art to provide aperture 120 having relatively straight side walls. For example, in accordance with one such lithography technique, photoresist 110 was exposed to a beam of electrons, photons, or ions by either passing a flood beam through a mask or scanning a focused beam. The beam changed the chemical structure of an exposed area of photoresist layer 110 so that, when immersed in a developer, either the exposed area or an unexposed area of photoresist layer 110 (depending on the type of photoresist used) was removed to recreate a pattern, or its obverse, of the mask or the scanning. Next, as shown in FIG. 1B, aperture 120 has been undercut in accordance with any one of a number of methods that are well known to those of ordinary skill in the art to form aperture 130 in photoresist mask layer 110. Next, as shown in FIG. 1C, a relatively thin metal layer has been blanket-deposited over the structure shown in FIG. 1B. As is well known, metal thin film deposition techniques such as, for example and without limitation, physical vapor deposition ("PVD") or sputtering (and excepting conformal deposition techniques such as, for example and without limitation, chemical vapor deposition ("CVD") and electroplating) provide limited step coverage. As a result, metal deposited using such techniques does not coat steep or undercut steps. Thus, as shown in FIG. 1C, after blank metal deposition, the undercut side walls of aperture 130 are not coated. In other words, the use of undercut aperture 130 in photoresist mask layer 110 avoids side wall metal deposition, and provides discontinuous metal regions on substrate 100 and photoresist mask layer 110. Lastly, as shown in FIG. 1D, a photoresist lift-off process has been carried out in accordance with any one of a number of methods that are well known to those of ordinary skill in the art to provide patterned metal feature 150 on substrate 100. As is well known, during the lift-off process, photoresist material under metal film 140 is removed using, for example and without limitation, a solvent or a photoresist stripper. As a result, metal film 140 is removed, and patterned metal feature 150 that was deposited directly on substrate 100 remains.

Lithography is an important technique or process in micro-fabrication that is used to fabricate semiconductor integrated electrical circuits, integrated optical, magnetic, mechanical circuits and microdevices, and the like. As is well known, and as was discussed above, lithography may be used to create a pattern in a thin film carried on a substrate or wafer so that, in subsequent processing steps, the pattern can be replicated in the substrate or in another material that is deposited on the substrate. An imprint lithography technology for producing nanostructures with 10 nm feature sizes has been discussed in the literature. One embodiment of imprint lithography—referred to in the art as Step and Flash Imprint Lithography ("SFIL")—is disclosed in an article by B. J. Smith, N. A. Stacey, J. P. Donnelly, D. M. Onsongo, T. C. Bailey, C. J. Mackay, D. J. Resnick, W. J. Dauksher, D. Mancini, K. J. Nordquist, S. V. Sreenivasan, S. K. Banerjee, J. G. Ekerdt, and C. G. Willson entitled "Employing Step and Flash Imprint Lithography for Gate Level Patterning of a MOSFET Device" *SPIE Microlithography Conference, February* 2003, which article is available on the Internet at www.molecularimprints.com, and which article is incorporated by reference herein. SFIL is a lithography technique that enables patterning of sub-100 nm features at a cost that has the potential to be substantially lower than either conventional projection lithography or proposed next generation lithography techniques. As described in the article, SFIL is a molding process that transfers the topography of a rigid transparent template using a low-viscosity, UV-curable organosilicon solution at room temperature with low pressure mechanical processes.

One such SFIL process is illustrated in conjunction with FIGS. 2A–2F. As shown in FIG. 2A, thinorganic layer 210 (referred to as a transfer layer) has been spin-coated on silicon substrate 200. Next, a small amount of low viscosity, photopolymerizable, organosilicon solution 220 is dispensed over transfer layer 210 in an area to be imprinted (solution 220 is sometimes referred to as an "imprinting material"). The viscosity of solution 220 is sufficiently low so that minimal pressure (for example and without limitation, a pressure of about 2–4 psi) and no additional heating is necessary to move the liquid into an imprint template. For example, solution 220 may be a solution of an organic monomer, a silylated monomer, and a dimethyl siloxane oligomer ("DMS") and a multifunctional cross-linker. Each component plays a role in the imaging process. For example: (a) the free radical generator initiates polymerization upon exposure to actinic (typically UV) radiation; (b) the organic monomer ensures adequate solubility of the free radical generator, desirable cohesive strength of cured imprinting material and adhesion to underlying organic transfer layer 210; (c) and the silylated monomers and the DMS provide silicon required to provide high-oxygen etch resistance (useful in subsequent processing steps described below); and (d) multi-functional crosslinker provides chemical crosslinking. In addition, these monomer types help maintain a low viscosity that is useful during imprinting. In further addition, the silylated monomer and the DMS derivative also lower the surface energy of solution 220, thereby enhancing a separation process (described below). Advantageously, the organic monomer polymerizes in a fraction of a second using low cost, broadband light sources. For example, as described in the article, solution 220 consisted of 15% (w/w) ethylene glycol diacrylate (obtained from Aldrich Chemical Company of Milwaukee, Wis.), 44% (3-acryloxypropyl)tris(trimethylsiloxy)silane (obtained under the trade name SIA0210.0 from Gelest, Inc. of Morrisville, Pa.), 37% t-butyl acrylate (obtained from Lancaster Synthesis Inc. of Windham, N.H.), and 4% 2-hydrozy-2-methyl-1-phenyl-propan-1-one (obtained under the trade name Darocur 1173 from CIBA® of Tarrytown, N.Y.).

Next, as shown in FIG. 2B, template 230—bearing patterned relief structures (for example and without limitation, a circuit pattern) and whose surface was treated with a fluorocarbon release film—was aligned over dispensed solution 220 and moved to decrease a gap between template 230 and substrate 200. This displaced solution 220, and filled the patterned relief structures on template 230. Suitable release layers are described in an article by D. J. Resnick, D. P. Mancini, S. V. Sreenivasan, and C. G. Willson entitled "Release Layers for Contact and Imprint Lithography" *Semiconductor International*, June 2002, pp. 71–80, which article is incorporated by reference herein. As is known, it is desired that a template release layer has a low enough surface energy to enable template/substrate separation, and also is reasonably durably bonded to the template surface to remain functional after a number of imprints. Alkyltrichlorosilanes form strong covalent bonds with a surface of fused silica, or $SiO_2$. In addition, in the presence of surface water, they react to form silanol intermediates which undergo a condensation reaction with surface hydroxyl groups and adjacent silanols to form a networked siloxane monolayer. When this functional group is synthetically attached to a long fluorinated aliphatic chain, a bifunctional molecule suitable as a template release film may be created. The silane-terminated end bonds itself to a template's surface, providing durability useful for repeated imprints. The fluorinated chain, with its tendency to orient itself away from the surface, forms a tightly packed comb-like structure, and provides a low-energy release surface. Annealing further enhances the condensation, thereby creating a highly networked, durable, low surface energy coating.

Next, as shown in FIG. 2C, once filling has occurred, the area is irradiated with broadband UV ultraviolet light (for example and without limitation, a 500 W Hg arc lamp) through a back side of template 230, and cross-linking of solution 220 occurs.

Next, as shown in FIG. 2D, template 230 and substrate 200 are mechanically separated to expose cured, organosilicon relief pattern 240 (an imprinted version of the relief pattern in template 230) that is disposed on residual layer 250 (a residue of cross-linked solution 220). The SFIL steps illustrated in FIGS. 2A–2D may be carried out in a tool described by I. McMackin, P. Schumaker, D. Babbs, J. Choi, W. Collison, S. V. Sreenivasan, N. Schumaker, M. Watts, and R. Voisin in an article entitled "Design and Performance of a Step and Repeat Imprinting Machine" *SPIE Microlithography Conference*, February 2003, which article is available on the Internet at www.molecularimprints.com, and which article is incorporated by reference herein.

Next, etching is performed in a two-step process. S. C. Johnson, T. C. Bailey, M. D. Dickey, B. J. Smith, E. K. Kim, A. T. Jamieson, N. A. Stacey, J. G. Ekerdt, and C. G. Willson describe suitable etch processes in an article entitled "Advances in Step and Flash Imprint Lithography" *SPIE Microlithography Conference*, February 2003, which article is available on the Internet at www.molecularimprints.com, and which article is incorporated by reference herein. As set forth in the article, the first etch step, referred to as a "break-through etch," anisotropically removes residual cross-linked layer 250 to break through to underlying transfer later 210. The second etch step, referred to as a "transfer etch," uses the remaining cross-linked relief pattern 240 as an etch mask to transfer the pattern into underlying transfer layer 210. In one embodiment of SFIL, silicon in polymerized solution 220, and lack of silicon in transfer layer 210, provides etch selectivity between polymerized solution 220 and transfer layer 210. In such an embodiment, the etching may be done in a LAM Research 9400SE obtained from Lam Research, Inc. of Fremont, Calif.

As shown in FIG. 2E, a halogen "breakthrough etch" was performed. For example and without limitation, the halogen etch described in the article was an anisotropic halogen reactive ion etch ("RIE") rich in fluorine, i.e., wherein at least one of the precursors was a fluorine-containing material (for example and without limitation a combination of $CHF_3$ and $O_2$, where the organosilicon nature of solution 220 called for the use of a halogen gas). Other suitable halogen compounds include, for example and without limitation, $CF_4$. This etch is similar to a standard $SiO_2$ etch performed in modern integrated circuit processing. Lastly, as shown in FIG. 2F, an anisotropic oxygen reactive ion etch was used to transfer features 260 to underlying substrate 200. The remaining silicon containing features 260 served as an etch mask to transfer the pattern to underlying substrate 200. The "transfer etch" was achieved with a standard, anisotropic, oxygen RIE processing tool.

In order to imprint sub-100 nm features, it is useful to avoid intermixing between an imprinting material and a transfer layer. Intermixing may cause problems such as, for example and without limitation, distortion of features when an imprint template is separated from a substrate after exposure to polymerizing radiation. This can be particularly problematic when feature thicknesses are as small as 50 to 100 nm. In addition, intermixing may be particularly problematic when using an imprinting material comprised of low viscosity acrylate components because such components have solvency toward many polymers. Because of this, some have used a cross-linked BARC material (BARC or "bottom antireflective coating" is an organic antireflective coating that is typically produced by a spin-on process) as a transfer layer. However, because BARC is cross-linked, it cannot be undercut by conventional wet developers and removed by organic photostrippers. As a result, the above described method for fabricating patterned metal features using lift-off cannot be used.

In light of the above, there is a need for methods for fabricating patterned features utilizing imprint lithography that overcome one or more of the above-identified problems.

SUMMARY OF THE INVENTION

One or more embodiments of the present invention satisfy one or more of the above-identified needs in the art. In particular, one embodiment of the present invention is a method for generating patterned features on a substrate that includes: (a) forming a first layer on at least a portion of a surface of the substrate, the first layer comprising at least one layer of a first material, which one layer abuts the surface of the substrate; (b) forming a second layer of a second material on at least a portion of the first layer, which second layer is imprinted with the patterned features; (c) removing at least portions of the second layer to extend the patterned features to the first layer; and (d) removing at least portions of the first layer to extend the patterned features to the substrate; wherein the first layer and the second layer may be exposed to an etching process that undercuts the patterned features, and the first material may be lifted-off.

DETAILED DESCRIPTION OF THE INVENTION

FIGS. 3A–3I illustrate a step-by-step sequence for fabricating patterned features in accordance with one or more embodiments of the present invention utilizing imprint lithography. Imprint lithography steps may be carried using a tool described by I. McMackin et al. in an article entitled "Design and Performance of a Step and Repeat Imprinting Machine" *SPIE Microlithography Conference*, February 2003, which article is cited in the Background of the Invention, and which article is incorporated by reference herein.

Figure 1A:
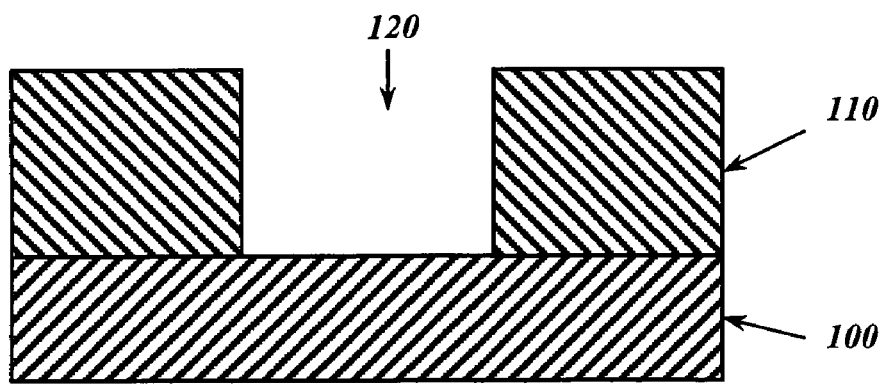
FIGS. 1A–1D illustrate a well known process for fabricating patterned metal features in which a photoresist mask is undercut by a developer prior to metal deposition.
Figure 1B:
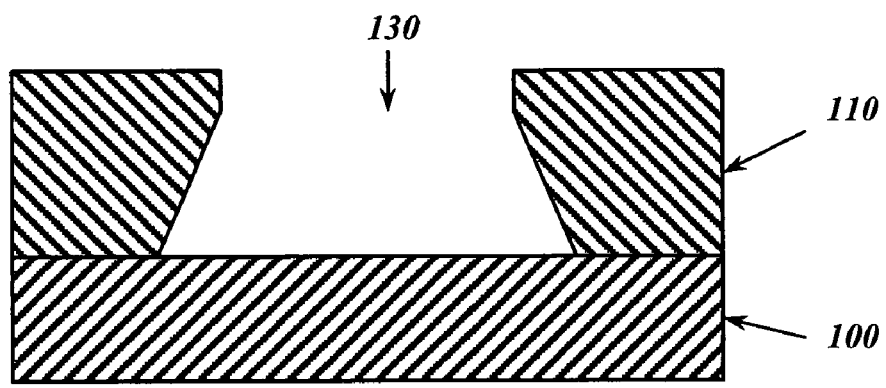
Figure 1C:
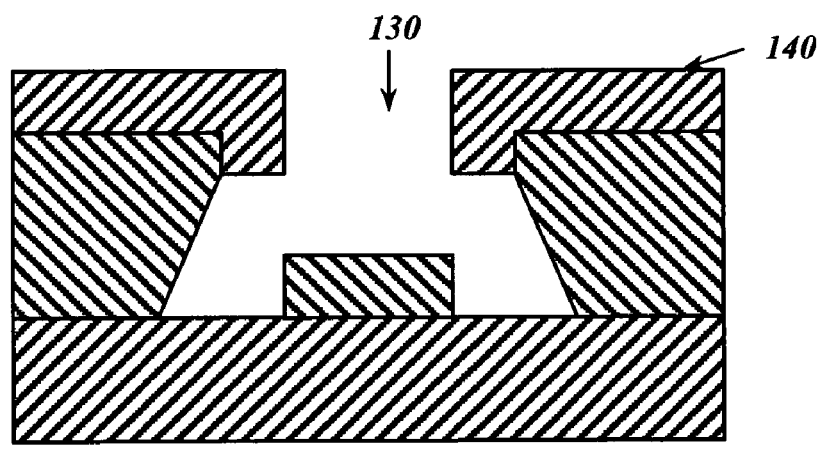
Figure 1D:
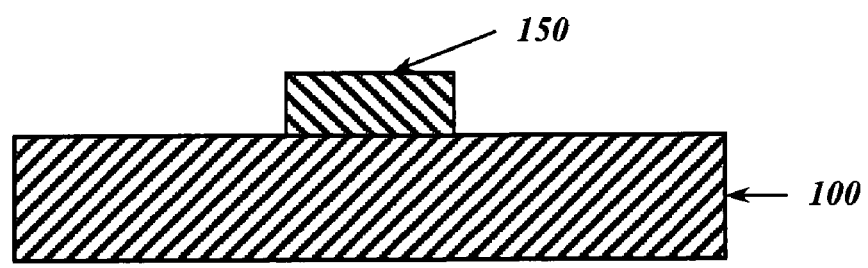
Figure 2A:
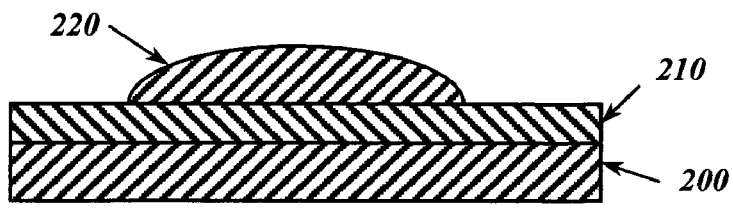
FIGS. 2A–2F illustrate a step-by-step sequence for carrying out one example of one type of imprint lithography process, a Step and Flash Imprint Lithography ("SFIL") process.
Figure 2B:
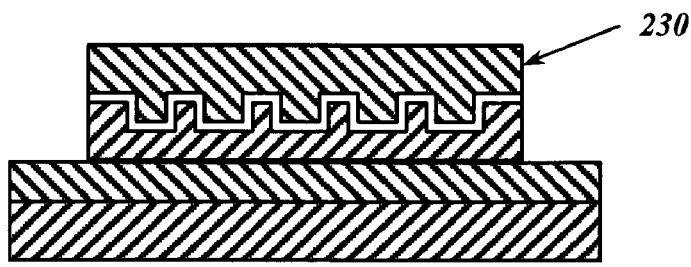
Figure 2C:
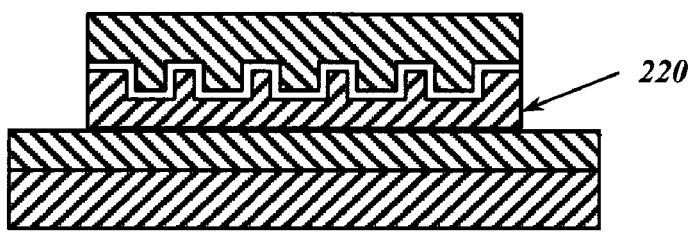
Figure 2D:
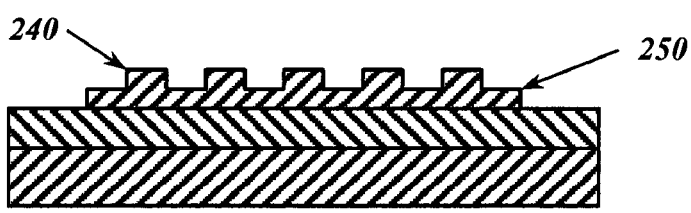
Figure 2E:
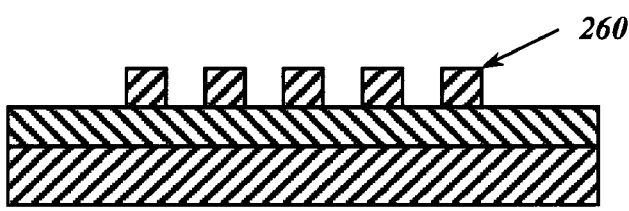
Figure 2F:
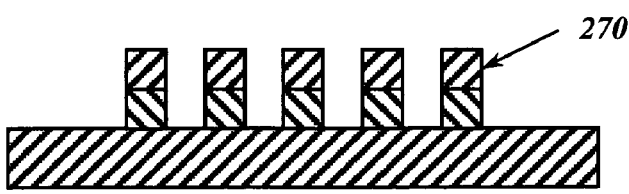
Figure 3A:
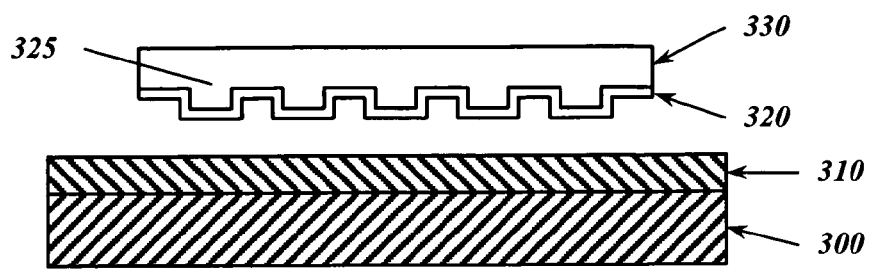
FIGS. 3A–3I illustrate a step-by-step sequence for fabricating patterned features in accordance with one or more embodiments of the present invention utilizing imprint lithography.
Figure 4:
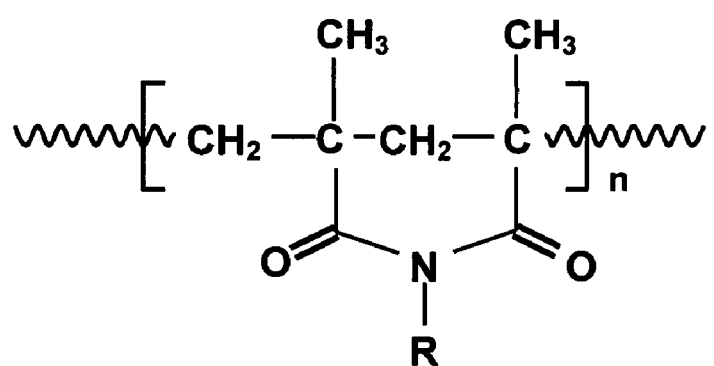
FIG. 4 shows a portion of a structure of a chemical used to fabricate a planarization and transfer layer in accordance with one or more embodiments of the present invention.

As shown in FIG. 3A, planarization and transfer layer 310 has been formed on substrate or wafer 300 using any one of a number of methods that are well known to those of ordinary skill in the art such as, for example and without limitation, by spin-coating to provide a substantially continuous, planar surface over substrate 300. In accordance with one or more embodiments of the present invention, an inventive planarization and transfer layer is a polymer containing a poly(dimethylglutarimide) ("PMGI") structure. FIG. 4 shows the structure of PMGI used to form the polymer of inventive planarization and transfer layer. Advantageously, in accordance with one or more embodiments of the present invention, a planarization and transfer layer based on PMGI has the following beneficial properties that solve one or more of the problems identified in the Background of the Invention: (a) little, if any, interfacial mixing with acrylic-based imprinting fluids; (b) such a planarization and transfer layer is removable in developer(s)/stripper(s), for example and without limitation, wet developer(s)/stripper(s) (it is believed that this is because such a planarization and transfer layer is not cross-linked by exposure to the UV radiation used to polymerize the imprinting fluid); and (c) such a planarization and transfer layer does not cross-link in response to UV radiation.

A polymer containing a PMGI structure that is suitable for use in carrying out one or more embodiments of the present invention may be obtained under the trade name SF7S ("PMGI SF7S") from MicroChem Corp. of Newton, Mass. Other polymers containing a PMGI structure that are also suitable for use in carrying out one or more embodiments of the present invention may be obtained under the trade names LOL1000 and LOL2000 from Shipley Company, L.L.C. of Marlborough, Mass. In accordance with one embodiment of the present invention, PMGI SF7S was spin coated on a silicon wafer at about 3,000 rpm (conventional spin-coaters may rotate at speeds from about 500 to about 6000 rpm). The wafer was soft baked at about 180° C. for about 5 min, and a thickness of the PMGI layer was about 500 nm. Advantageously further embodiments of the present invention may be fabricated readily by one of ordinary skill in the art without undue experimentation since the developmental characteristics of a polymer containing a PMGI structure may be controlled by bake time and bake temperature.

As further indicated in FIG. 3A, feature pattern 325 has been fabricated on imprint template 330 using any one of a number of methods that are well known to those of ordinary skill in the art. In accordance with one or more embodiments of this imprint lithography process, imprint template 330 may have a nanoscale relief structure formed therein having an aspect ratio ranging, for example and without limitation, from about $1 \times 10^{-5}$ to about 10. Specifically, the relief structures in imprint template 330 may have a width that ranges, for example and without limitation, from about 10 nm to about 5000 μm, and the relief structures may be separated from each other by a distance that ranges, for example and without limitation, from about 10 nm to about 5000 μm. In accordance with one or more embodiments of the present invention, imprint template 330 may be comprised of material that is transparent, at least to a desired extent, to radiation utilized to cross-link an imprint fluid. Such material may be, for example and without limitation, $SiO_2$, in the form of quartz, fused-silica, sapphire and the like.

In accordance with one or more embodiments of the present invention, a surface of imprint template 330 may be treated with a surface modifying agent such as a fluorocarbon silylating agent to promote release of imprint template 330 after transfer of feature pattern 325. In addition, in accordance with one or more embodiments of this imprint lithography process, the step of treating the surface of imprint template 330 may be carried out utilizing a technique such as, for example and without limitation, a plasma technique, a chemical vapor deposition technique, a solution treatment technique, and combinations thereof. In accordance with one or more further embodiments of the present invention, the release properties of imprint template 330 may be improved by conditioning feature pattern 325 of imprint template 330 by exposing it to a conditioning mixture including an additive that will remain on imprint template 330 to reduce the surface energy of its surface. An exemplary additive is a surfactant such as, for example and without limitation, a mixture that includes approximately 0.1% or more of a surfactant available under the trade name ZONYL® FSO-100 from DUPONT™ having a general structure of $R_1R_2$ where $R_1=F(CF_2{}_{CF2})_Y$, with y being in a range of 1 to 7, inclusive and $R_2=CH_2{}_{CH2}O(CH_2CH_2O)_XH$, where X is in a range of 0 to 15, inclusive—with the remainder comprising isopropyl alcohol ("IPA") Exposure of feature pattern 325 may be achieved by virtually any manner known in the art, including dipping feature pattern 325 into a volume of the conditioning mixture, wiping the pattern with a cloth saturated with the conditioning mixture and spraying a stream of the conditioning mixture onto the surface. The IPA in the conditioning mixture is allowed to evaporate before using imprint template 330. In this manner, the IPA facilitates removing, from the pattern, undesired contaminants while leaving the additive, thereby conditioning the surface of the pattern. In accordance with one or more still further embodiments of the present invention, the feature pattern of imprint template 330 may be conditioned by pattern priming. Pattern priming is achieved by selectively contacting the imprint fluid (to be described below) with the pattern a sufficient number of times to accurately reproduce a pattern complementary to the initial pattern. Specifically, by repeatedly contacting the imprint fluid, the complementary pattern formed improves with each successive imprint. After a sufficient number of imprints, an accurate complementary reproduction of the pattern in imprint template 330 is formed.

In addition, in accordance with one or more embodiments of the present invention, and has been indicated in FIG. 3A, release layer 320 has been deposited on imprint template 330. An important factor in accurately forming feature pattern 325 is to reduce, if not prevent, adhesion of polymerized imprint fluid to imprint template 330'. A release layer is typically hydrophobic and/or has low surface energy. Providing polymerized imprint fluid with improved release characteristics minimizes distortions in feature pattern 325 recorded into the polymerized imprint fluid upon template separation. This type of release layer may be referred to as an a priori release layer, i.e., a release layer that is solidified to the mold. Suitable release layers are described in an article by D. J. Resnick, D. P. Mancini, S. V. Sreenivasan, and C. G. Willson entitled "Release Layers for Contact and Imprint Lithography" *Semiconductor International*, June 2002, pp. 71–80, which article is cited in the Background of the Invention, and which article is incorporated by reference herein.

As further indicated in FIG. 3A, imprint template 330 is aligned over and spaced apart from planarization and transfer layer 310.

Figure 3B:
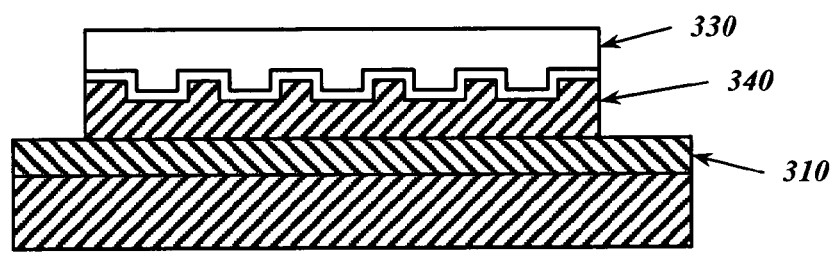

Next, as shown in FIG. 3B, polymerizable fluid 340 (also referred to as an "imprint fluid" or "imprint material") has been dispensed over planarization and transfer layer 310 using any one of a number of methods that are well known to those of ordinary skill in the art such as, for example and without limitation, by dispensing as a plurality of fluid beads or droplets. As further shown in FIG. 3B, imprint template 330 has been brought close enough to polymerizable fluid 340 so that the features in feature pattern 325 of imprint template 330 have been filled with polymerizable fluid 340. Note that polymerizable fluid 340 has a viscosity sufficiently low that it may rapidly and evenly spread and fill the features in an efficient manner, for example and without limitation, a viscosity in a range from about 0.01 cps to about 100 cps measured at 25° C. In addition, polymerizable fluid 340 has an ability to wet the surface of planarization and transfer layer 310 and imprint template 330, and to avoid subsequent pit or hole formation after polymerization.

The constituent components that form polymerizable fluid 340 to provide the aforementioned characteristics may differ. This results from substrate 300 being formed from a number of different materials. As a result, the chemical composition of planarization and transfer layer 310 varies dependent upon the material from which substrate 300 is formed. For example, and without limitation, substrate 300 may be formed from silicon, plastics, gallium arsenide, mercury telluride, and composites thereof. Additionally, substrate 300 may include one or more layers, for example and without limitation, dielectric layers, metal layers, semiconductor layers, and the like.

In accordance with one or more such embodiments of the present invention, polymerizable fluid 340 comprises further constituents that provide its low viscosity, selectable etchability with respect to planarization and transfer layer 310 (to be described in detail below). In accordance with one or more such embodiments of the present invention, polymerizable fluid 340 is comprised of a silicon-containing material such as, for example and without limitation, an organosilane.

An exemplary composition for the silicon-containing material includes: (a) isobornyl acrylate (obtained from Aldrich Chemical Company of Milwaukee, Wis.); (b) acryloxymethyltrimethylsilane (obtained under the trade name XG-1039 from Gelest, Inc. of Morrisville, Pa.); (c) (3-acryloxypropyltristrimethylsiloxy)silane (obtained under the trade name SIA0210.0 from Gelest, Inc. of Morrisville, Pa.); (d) a fluorinated surfactant (obtained under the trade name FC4432 from 3M Company St. Paul, Minn.); (e) ethylene glycol diacrylate (obtained under the trade name EGDA from Aldrich Chemical Company of Milwaukee, Wis.); and (f) UV photoinitiator (for example and without limitation, 2-hydroxy-2-methyl-1-phenyl-propan-1-one) (obtained under the trade name Darocur 1173 from CIBA® of Tarrytown, N.Y.). In an exemplary such composition, isobornyl acrylate comprises approximately 30% by weight of the composition, acryloxymethyltrimethylsilane comprises approximately 40% by weight of the composition, (3-acryloxypropyltristrimethylsiloxy)silane comprises approximately 10% by weight of the composition, the fluorinated surfactant comprises approximately 0.5% by weight of the composition, ethylene glycol diacrylate comprises approximately 20% by weight of the composition, and the UV photoinitiator comprises approximately 3% by weight of the composition. Further useful compositions using the above-described materials may be determined readily by one of ordinary skill in the art without undue experimentation. Advantageously, little or no interfacial mixing occurs between polymerizable fluid 340 and planarization and transfer layer 310 for these above-described embodiments.

In accordance with one or more alternative embodiments of the present invention, polymerizable fluid 340 may comprise a nonsilicon-containing material such as, for example and without limitation, (a) isobornyl acrylate; (b) n-hexyl acrylate; (c) ethylene glycol diacrylate; and (d) 2-hydroxy-2-methyl-1-phenyl-propan-1-one. In one such exemplary composition, isobornyl acrylate comprises approximately 55% of the composition, n-hexyl acrylate comprises approximately 27% of the composition, ethylene glycol diacrylate comprises approximately 15% of the composition, and the UV initiator, for example and without limitation, 2-hydroxy-2-methyl-1-phenyl-propan-1-one, comprises approximately 3% of the composition. The above-identified composition may also include stabilizers that are well known in the chemical art to increase the operational life of the composition. Further useful compositions using the above-described materials may be determined readily by one of ordinary skill in the art without undue experimentation.

To improve the release properties of imprint template 330 and polymerized layer 345 and to ensure that polymerized layer 345 does not adhere to imprint template 330, the composition from which polymerizable fluid layer 340 is formed may include an additive that reduces the surface tension thereof. To that end, polymerizable fluid layer 340 may include, as an additive, a surfactant. For purposes of this patent application, a surfactant is defined as any molecule, one tail of which is hydrophobic. Surfactants may be either fluorine containing, e.g., including a fluorine chain, or may not include any fluorine in the surfactant molecule structure.

An exemplary surfactant is available under the trade name ZONYL® FSO-100 from DUPONT™ that has a general structure of $R_1R_2$ where $R_1=F(CF_2CF_2)_y$, with y being in a range of 1 to 7, inclusive and $R_2=CH_2$ $_{CH2}O(CH_2CH_2O)_xH$, where X is in a range of 0 to 15, inclusive. This provides one or more embodiments of polymerizable fluid 340 with the following composition: (a) isobornyl acrylate; (b) n-hexyl acrylate; (c) ethylene glycol diacrylate; (d) 2-hydroxy-2-methyl-1-phenyl-propan-1-one; and (e) $R_fCH_2CH_2O(CH_2CH_2O)_xH$. In accordance with one or more such embodiments, the ZONYL® FSO-100 additive comprises less than 1% of the composition, with the relative amounts of the remaining components being as discussed above. However, the percentage of ZONYL®FSO-100 may be greater than 1%. An advantage provided by the latter composition is that it may abrogate the need for an a priori release layer, i.e., a separate hydrophobic and/or low surface energy release layer disposed on imprint template 330. Specifically, the latter composition provides desirable release properties to imprint template 330 and polymerizable fluid 340 so that polymerized layer 345 (described below) does not adhere to imprint template 330 with sufficient force to distort a feature pattern recorded therein.

Figure 5:
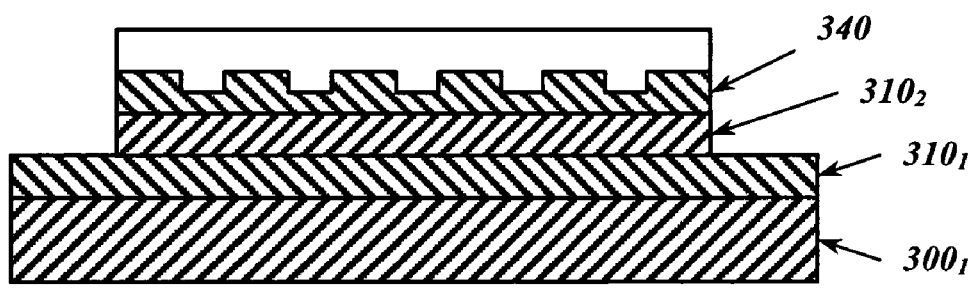
FIG. 5 illustrates an alternative step for that illustrated in FIG. 3B.

FIG. 5 illustrates an alternative step for that illustrated in FIG. 3B. As shown in FIG. 5, instead of using planarization and transfer layer 310, substrate 300 has been covered using any one of a number of methods that are well known to those of ordinary skill in the art with two layers, i.e., planarization and transfer layer $310_1$ and planarization and transfer layer $310_2$. In accordance with one or more embodiments of the present invention, planarization and transfer layer $310_1$ is a polymer containing a PMGI structure, and planarization and transfer layer $310_2$ is a DUV30J-6 BARC layer that is spin coated on top of planarization and transfer layer $310_1$. In accordance with one such embodiment, (a) the polymer containing a PMGI was formed as was described above; (b) the BARC layer was cured at about 180° C. for about 60 sec; and (c) polymerizable fluid 340 was a silicon containing fluid that was formed as was described above. Advantageously, little or no interfacial mixing occurs between polymerizable fluid 340 and planarization and transfer layers $310_1$ and $310_2$ for such alternative embodiments.

Figure 3C:
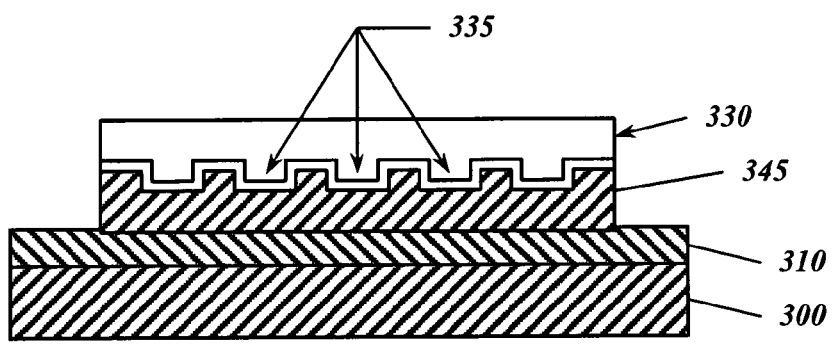

Next, as shown in FIG. 3C, the structure shown in FIG. 3B is exposed to blanket actinic radiation such as, for example and without limitation, UV radiation 335, through imprint template 330 to cross-link a substantial portion of polymerizable fluid 340 and to convert it into polymerized layer 345. For example and without limitation, polymerizable fluid 340 was exposed for about 30 sec to UV radiation (having a wavelength of about 365 nm and having an intensity of about 15 mW/cm$^2$). It should be understood that the particular radiation employed to initiate the polymerization of polymerizable fluid 340 may be determined by one of ordinary skill in the art depending on a specific application which is desired.

Figure 3D:
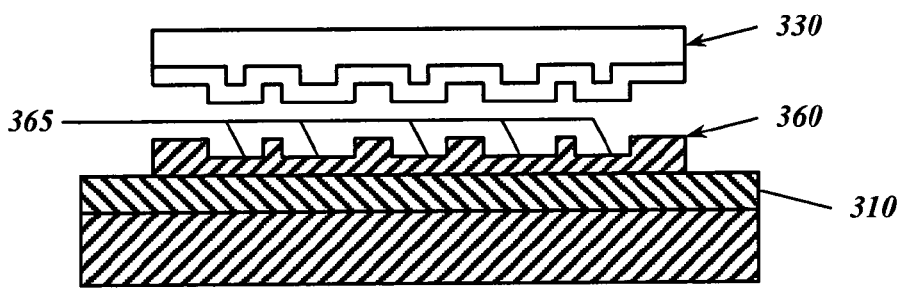
Figure 3E:
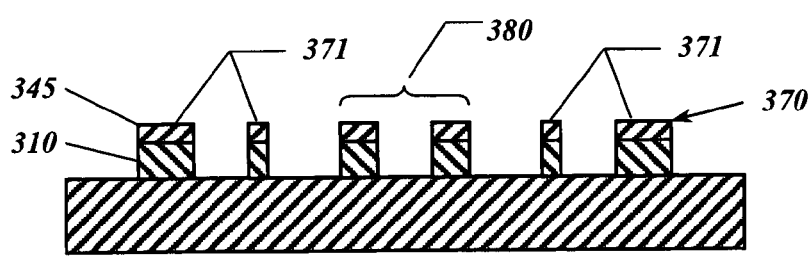

Next, as shown in FIGS. 3D and 3E, imprint template 330 is withdrawn to provide high resolution, low aspect ratio relief pattern 360 that defines a residual layer 365 in polymerized layer 345. Also note residual material 365 that may be in the form of: (1) a portion of polymerizable fluid, (2) a portion of polymerized fluid, or (3) combinations of (1) and (2). Thereafter, relief pattern 360 is anisotropically etched to remove residual layer 365 using any one of a number of methods that are well known to those of ordinary skill in the art. A selective etch is then employed to etch both polymerized layer 345 and planarization and transfer layer 310. In accordance with one or more embodiments of the present invention, the etching selectivity of planarization and transfer layer 310 relative to polymerized layer 345 may range, for example and without limitation, from about 1.5:1 to about 100:1. Further, in accordance with one or more further embodiments of the present invention, the selective etching may be carried out by a halogen-rich (for example and without limitation, fluorine rich) reactive ion etch process. Such halogen-rich etch processes may utilize precursors such as, for example and without limitation, $CHF_3$ and $CF_4$. In addition, planarization and transfer layer 310 has been selectively etched to substrate 300 using any one of a number of methods that are well known to those of ordinary skill in the art to provide high resolution, high aspect ratio feature pattern 370, with the features there comprising a stacked structure 371 that includes portions of polymerized layer 345 and planarization layer 310. In accordance with one or more further embodiments of the present invention, the selective etching may be carried out by an oxygen plasma etch process. As is well known, such etching processes may be carried out in any one of a number of apparatus that are commercially available from suppliers such as, for example and without limitation, Lam Research, Inc. of Fremont, Calif.

Figure 3F:
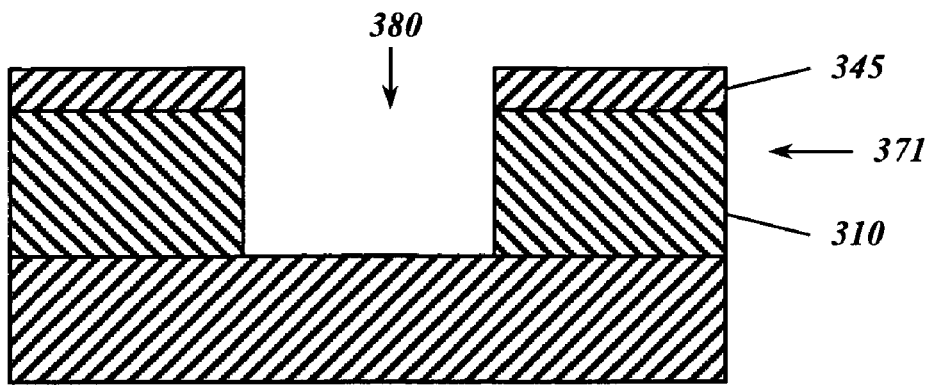

Next, FIG. 3F shows aperture 380 that is a portion of high resolution, high aspect ratio feature pattern 370 illustrated in FIG. 3E.

Figure 3G:
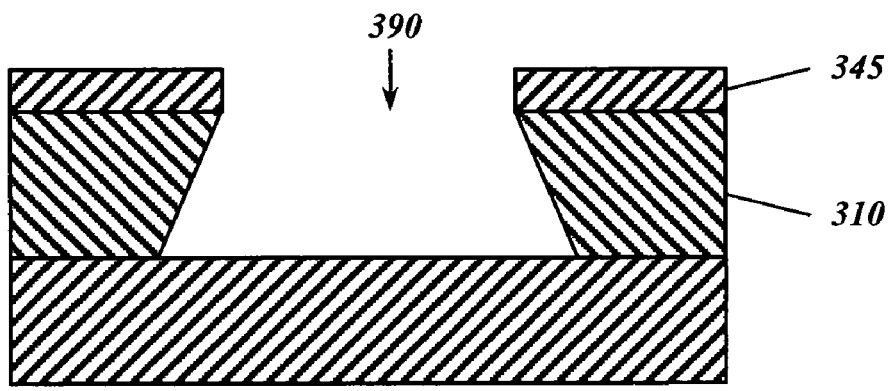
Figure 3H:
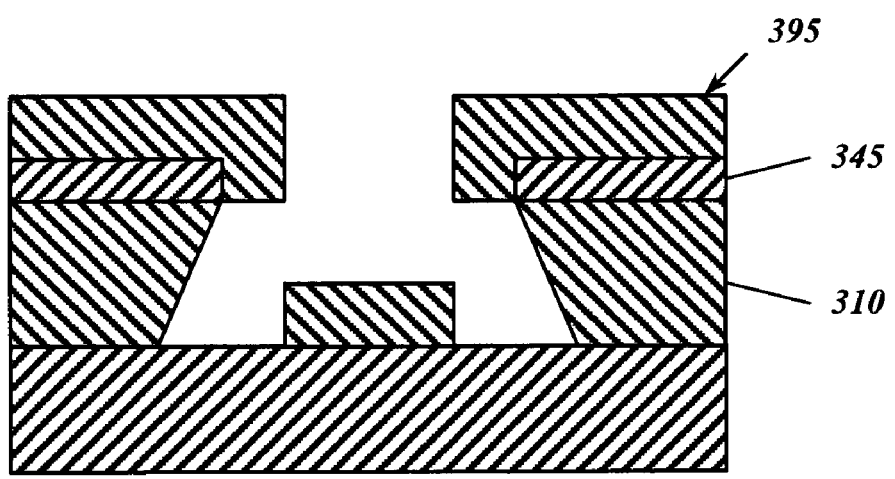

Next, as shown in FIGS. 3H and 3G, the sidewalls of aperture 380 have been undercut by immersion in a developer/stripper, which developer/stripper etches the sidewalls (selectively with respect to cross-linked polymerized layer 345) to form stacked structure 371 with an aperture 390 having a re-entrant shape. For example, a polymer containing a PMGI structure can be developed/stripped in tetramethylammonium hydroxide (TMAH) that may be obtained under the trade name CD26 from Shipley Company, L.L.C. of Marlborough, Mass. In accordance with one such embodiment of the present invention, 0.26N TMAH (i.e., 0.26 normal concentration of TMAH, where 0.26N is an industry-accepted standard concentration for TMAH developer/stripper) was used. Advantageously, in accordance with one or more embodiments, polymerized fluid 345 does not etch (i.e., dissolve) in 0.26N TMAH while a polymer containing a PMGI structure etches (i.e., dissolves) slowly therein to provide undercutting. In accordance with one or more further embodiments of the present invention, polymerized fluid 345 may also be etched in a developer/stripper used to etch planarization and transfer layer 310. However, it is believed that better undercutting is provided when the material forming polymerized fluid 345 etches only very slowly or at a slower rate than that of the material forming planarization and transfer layer 310.

Next, as shown in FIG. 3H, a relatively thin metal layer 395 has been blanket-deposited over the structure shown in FIG. 5G utilizing a reasonably directional deposition technique such as, for example and without limitation, physical vapor deposition ("PVD") or sputtering.

Figure 3I:
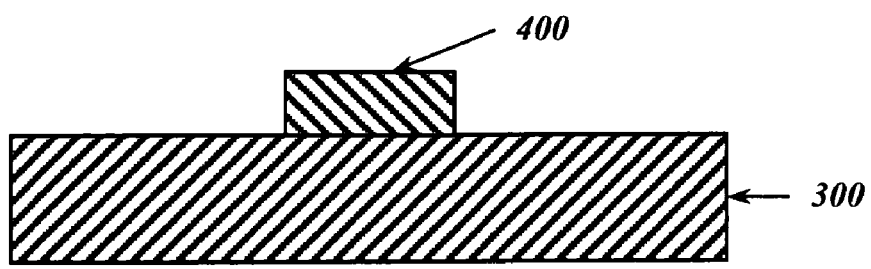

Next, as shown in FIG. 3I, a lift-off process has been carried out to provide patterned metal feature 400 on substrate 300. For example and without limitation, a polymer containing a PMGI structure can be lifted off using an N-methylpyrrolidinone ("NMP") based stripper such as, for example and without limitation, a stripper obtained under the trade name Remover 1165 from Shipley Company, L.L.C. of Marlborough, Mass. In addition, in accordance with one such embodiment, the substrate may be processed by ultrasonic immersion in Remover 1165 at, for example and without limitation, about 50° C.

Lastly, an optional final cleaning step may be performed by rinsing the wafer in IPA and blowing it dry. Optionally, this step may be followed by an oxygen plasma etching step.

Although various embodiments that incorporate the teachings of the present invention have been shown and described in detail herein, those skilled in the art can readily devise many other varied embodiments that still incorporate these teachings. For example and without limitation, further embodiments of the present invention exist wherein the planarization and transfer layer described above may be a high molecular weight (Mn>50,000) polyhydroxystyrene. However, for such embodiments, although such a planarization and transfer layer may slightly intermix with an acrylic-based polymerizable fluid, the combination may be suitable for certain applications. In addition, although the polymerizable fluid, as described above, is an acrylic-based composition, other embodiments exist wherein this is not the case.

What is claimed is:

1. A method for generating patterned features on a substrate that comprises:
   forming a first layer on at least a portion of a surface of the substrate, the first layer comprising at least one layer of a first material, which one layer abuts the surface of the substrate;
   forming a second layer of a second material on at least a portion of the first layer, which second layer is imprinted with the patterned features;
   removing at least portions of the second layer to extend the patterned features to the first layer; and
   removing at least portions of the first layer to extend the patterned features to the substrate;
   wherein the first layer and the second layer may be exposed to an etching process that undercuts the patterned features, and the first material may be lifted-off.

2. The method of claim 1 wherein the etching process causes etching of the first material and no etching of the second material.

3. The method of claim 1 method wherein the etching process causes etching of the first material and etching of the second material at a slower rate than a rate at which the first material is etched.

4. The method of claim 1 wherein the second layer does not intermix with the first layer.

5. The method of claim 1 wherein the step of removing at least portions of the second layer comprises dry etching.

6. The method of claim 1 wherein the step of removing at least portions of the first layer to extend the patterned features to the substrate does not remove second material.

7. The method of claim 1 wherein the first layer and the second layer are selectively etchable.

8. The method of claim 7 wherein the second layer comprises a silicon-containing material and the first layer comprises a non-silicon containing material.

9. The method of claim 8 wherein the step of removing at least portions of the second layer to extend the patterned features to the first layer comprises an anisotropic halogen etch.

10. The method of claim 9 wherein the anisotropic halogen etch is an anisotropic halogen reactive ion etch comprising a fluorine-containing precursor.

11. The method of claim 8 wherein the step of removing at least portions of the first layer to extend the patterned features to the substrate comprises an oxygen plasma etch.

12. The method of claim 1 wherein step of forming the second layer comprises dispensing an acrylic-based polymerizable fluid.

13. The method of claim 12 wherein the acrylic-based polymerizable fluid includes (a) isobomyl acrylate; (b) n-hexyl acrylate; (c) ethylene glycol diacrylate; and (d) 2-hydroxy-2-methyl-1-phenyl-propan-1-one.

14. The method of claim 13 wherein the acrylic-based polymerizable fluid further includes a surfactant.

15. The method of claim 12 wherein the acrylic-based polymerizable fluid includes (a) isobomyl acrylate; (b) acryloxymethyltrimethylsilane; (c) (3-acryloxypropyltristrimethylsiloxy)silane; (d) ethylene glycol diacrylate; and (f) a UV photoinitiator.

16. The method of claim 15 wherein the acrylic-based polymerizable fluid further includes a surfactant.

17. The method of claim 15 wherein the UV initiator comprises 2-hydroxy-2-methyt-1-phenyl-propan-1-one.

18. The method of claim 1 wherein the step of forming the first layer comprises coating a polymer containing a poly(dimethylglutarimide) ("PMGI") structure.

19. The method of claim 18 wherein coating comprises spin coating.

20. The method of claim 1 wherein the step of forming the first layer comprises coating a high molecular weight polyhydroxystyrene.

21. The method of claim 1 wherein the first layer comprises the one layer and another layer of another material disposed on the one layer, and the second layer does not intermix with the another layer.

22. The method of claim 21 wherein the etching process causes etching of the first material and no etching of the another material.

23. The method of claim 21 method wherein the etching process causes etching of the first material and etching of the another material at a slower rate than a rate at which the first material is etched.

24. The method of claim 21 wherein the another layer is a BARC layer.

25. The method of claim 1 further comprising:
   exposing the first layer and the second layer to an etching process that undercuts the patterned features.

26. The method of claim 25 wherein the step of forming the first layer comprises coating a polymer containing a poly(dimethylglutarimide) ("PMGI") structure.

27. The method of claim 26 wherein the step of exposing comprises exposing the first and second layer to tetramethylammonium hydroxide.

28. A method for generating patterned features on a substrate that comprises:
   forming a first layer on at least a portion of a surface of the substrate, the first layer comprising at least one layer of a first material, which one layer abuts the surface of the substrate, with forming the first layer comprising coating a polymer containing a poly(dimethylglutarimide) ("PMGI") structure;
   forming a second layer of a second material on at least a portion of the first layer, which second layer is imprinted with the patterned features;
   removing at least portions of the second layer to extend the patterned features to the first layer; and
   removing at least portions of the first layer to extend the patterned features to the substrate;

wherein the first layer and the second layer may be exposed to an etching process that undercuts the patterned features, and the first material may be lifted-off.

29. The method of claim 28 wherein coating comprises spin coating.

30. A method for generating patterned features on a substrate that comprises:

forming a first layer on at least a portion of a surface of the substrate, the first layer comprising at least one layer of a first material, which one layer abuts the surface of the substrate, with forming the first layer comprising coating a high molecular weight polyhydroxystyrene;

forming a second layer of a second material on at least a portion of the first layer, which second layer is imprinted with the patterned features;

removing at least portions of the second layer to extend the patterned features to the first layer; and removing at least portions of the first layer to extend the patterned features to the substrate;

wherein the first layer and the second layer may be exposed to an etching process that undercuts the patterned features, and the first material may be lifted-off.

31. A method for generating patterned features on a substrate that comprises:

forming a first layer on at least a portion of a surface of the substrate, the first layer comprising at least one layer of a first material, which one layer abuts the surface of the substrate, with forming the first layer comprising coating a polymer containing a poly(dimethylglutarimide) ("PMGI") structure;

forming a second layer of a second material on at least a portion of the first layer, which second layer is imprinted with the patterned features;

removing at least portions of the second layer to extend the patterned features to the first layer;

removing at least portions of the first layer to extend the patterned features to the substrate; and exposing the first layer and the second layer to tetramethylammonium hydroxide that undercuts the patterned features, and the first material may be lifted off.

* * * * *